United States Patent
Omer et al.

(10) Patent No.: US 9,191,250 B2
(45) Date of Patent: Nov. 17, 2015

(54) EXTENDED BANDWIDTH ADAPTIVE DIGITAL PRE-DISTORTION WITH RECONFIGURABLE ANALOG FRONT-ENDS

(71) Applicant: BlackBerry Limited, Waterloo (CA)

(72) Inventors: Mohammad Omer, Waterloo (CA); Stephen Arnold Devison, Kitchener (CA); Hamed Holisaz, Waterloo (CA); Oleksiy Kravets, Petersburg (CA)

(73) Assignee: BlackBerry Limited, Waterloo, Ontario (CA)

( * ) Notice: Subject to any disclaimer, the term of this patent is extended or adjusted under 35 U.S.C. 154(b) by 0 days.

(21) Appl. No.: 14/090,092

(22) Filed: Nov. 26, 2013

(65) Prior Publication Data

US 2015/0146769 A1 May 28, 2015

(51) Int. Cl.
*H04L 25/08* (2006.01)
*H04L 27/36* (2006.01)
*H04B 17/13* (2015.01)
*H03F 1/32* (2006.01)
*H03F 3/19* (2006.01)
*H03F 3/24* (2006.01)
*H04L 25/03* (2006.01)
*H04B 1/04* (2006.01)

(52) U.S. Cl.
CPC .............. *H04L 25/08* (2013.01); *H03F 1/3258* (2013.01); *H03F 3/19* (2013.01); *H03F 3/245* (2013.01); *H04B 17/13* (2015.01); *H04L 25/03159* (2013.01); *H04L 25/03343* (2013.01); *H04L 27/368* (2013.01); *H03F 2200/165* (2013.01); *H03F 2200/451* (2013.01); *H03F 2201/3215* (2013.01); *H04B 2001/0425* (2013.01)

(58) Field of Classification Search
USPC ................... 375/297, 232, 295, 296; 330/149
See application file for complete search history.

(56) References Cited

U.S. PATENT DOCUMENTS

| | | | |
|---|---|---|---|
| 7,136,626 B2 | 11/2006 | Bisanti et al. | |
| 7,620,377 B2 | 11/2009 | Dwyer | |
| 8,014,443 B2 * | 9/2011 | Nakamura et al. | 375/232 |
| 8,204,456 B2 | 6/2012 | Xu et al. | |
| 8,417,197 B2 * | 4/2013 | Farahani Samani et al. | 455/126 |
| 8,624,670 B2 * | 1/2014 | Woo | 330/149 |
| 8,779,851 B2 * | 7/2014 | Anvari | 330/149 |
| 2002/0008578 A1 * | 1/2002 | Wright et al. | 330/149 |
| 2003/0058959 A1 | 3/2003 | Rafie et al. | |

(Continued)

OTHER PUBLICATIONS

Extended European search report dated Apr. 24, 2015 for European Application No. 14195033.7.

*Primary Examiner* — Eva Puente
(74) *Attorney, Agent, or Firm* — Thomas Grzesik; Fleit Gibbons Gutman Bongini & Bianco P.L.

(57) ABSTRACT

A pre-distortion method. A signal to be transmitted Tx is pre-distorted to compensate for nonlinearities of a transmitter. The pre-distorted signal is filtered by an EBEE filter and a baseband filter. The EBEE filter has a filter characteristic of that cancels the baseband filter response over the range of frequencies from a first corner frequency of the baseband filter to a frequency of $N*f_B$ where N is a highest order of distortion component being cancelled and $f_B$ is the bandwidth of the original signal to be transmitted. This abstract is not to be considered limiting, since other embodiments may deviate from the features described in this abstract.

20 Claims, 9 Drawing Sheets

(56) References Cited

U.S. PATENT DOCUMENTS

| | | |
|---|---|---|
| 2004/0032912 A1 | 2/2004 | Ocenasek et al. |
| 2008/0084244 A1 | 4/2008 | Jelonnek |
| 2010/0177848 A1* | 7/2010 | Campbell et al. ............. 375/297 |
| 2012/0076250 A1 | 3/2012 | Kravtsov |
| 2013/0170582 A1 | 7/2013 | Rosendahl et al. |

* cited by examiner

1100

EXTENDED BANDWIDTH ADAPTIVE DIGITAL PRE-DISTORTION WITH RECONFIGURABLE ANALOG FRONT-ENDS

BACKGROUND

Pre-distortion is sometimes used to reduce the effect of distortion introduced in a radio transceiver's power amplifier or other transmitter nonlinearity. However, while this technique is useful and can reduce such distortion, the effectiveness of pre-distortion is often compromised by baseband filtering. Or, the baseband filtering requirements are rendered more complicated than otherwise necessary to achieve good pre-distortion performance or else receiver sensitivity can suffer.

BRIEF DESCRIPTION OF THE DRAWINGS

Example embodiments of the present disclosure will be described below with reference to the included drawings such that like reference numerals refer to like elements and in which.

DETAILED DESCRIPTION

Figure 1:
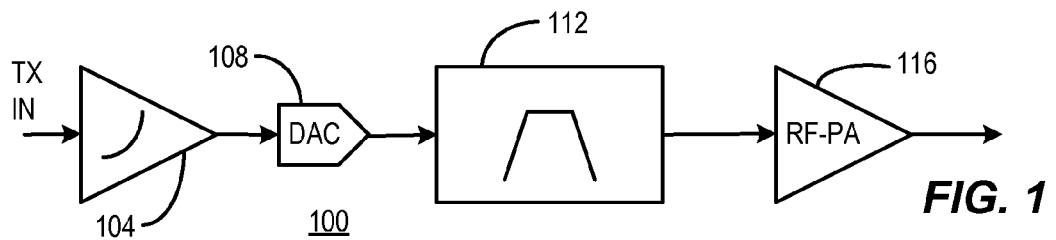
FIG. 1 is a block diagram of an illustrative example of pre-distortion used to correct for power amplifier distortion.

The various examples presented herein outline methods and electronic devices that provide for improved adaptive digital pre-distortion in radio transceivers that are especially well suited for an environment where radio front-ends are reconfigurable.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program" or "computer program" or "application" or similar terms, as used herein, is defined as a sequence of instructions designed for execution on a computer system. A "program", or "computer program", may include a subroutine, a function, a procedure, an object method, an object implementation, in an executable application, "app", an applet, a servlet, a source code, an object code, a shared library/dynamic load library and/or other sequence of instructions designed for execution on a computer system. The term "processor", "controller", "CPU", "computer" and the like as used herein encompasses both hard programmed, special purpose, general purpose and programmable devices and may encompass a plurality of such devices or a single device in either a distributed or centralized configuration without limitation.

Reference throughout this document to "one embodiment", "certain embodiments", "an embodiment", "an example", "an implementation", "certain implementations" or similar terms means that a particular feature, structure, or characteristic described in connection with the embodiment, example or implementation is included in at least one embodiment, example or implementation of the present invention. Thus, the appearances of such phrases or in various places throughout this specification are not necessarily all referring to the same embodiment, example or implementation. Furthermore, the particular features, structures, or characteristics may be combined in any suitable manner in one or more embodiments, examples or implementations without limitation.

The term "or" as used herein is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

Therefore, in accordance with certain aspects of the present disclosure, there is provided a pre-distortion method of correction of radio transmitter nonlinearity, that involves characterizing the transmitter nonlinearity as a distortion function $D(v)$, where v is an amplitude of the signal to be transmitted, and where the distortion components to be corrected are determined by the order of nonlinearity N to be corrected by the system; receiving a signal to be transmitted $T_x(f)$ having a maximum significant frequency component at frequency $f_{TX}$; using a pre-distorter having a transfer function $D_{PRE}(v)$ that models a distortion characteristic to produce a pre-distorted signal $Tx_{PRE}(f)=D_{PRE}(Tx(f))$; filtering the pre-distorted signal $Tx_{PRE}(f)$ with an Effective Bandwidth Enhancement Equalizer (EBEE) filter to produce a filtered pre-distorted signal $Tx_E(f)$; passing the filtered pre-distorted signal $Tx_E(f)$ through a baseband filter having filter characteristics $BB(f)$ to produce a corrected signal for transmission $Tx_C(f)=Tx_E(f)*BB(f)$, where the EBEE filter has a filter characteristic of $H_E(f)$, where $H_E(f)*BB(f)$ approximately equals 1 over the range of frequencies from a first corner frequency $f_C$ of BB(f) to frequency $N*f_{TX}$; up-converting the signal $Tx_C(f)$ to radio frequency for transmission; and transmitting the up-converted signal $Tx_C(f)$ at radio frequencies.

In certain implementations, the method further involves estimating a refined value of filter coefficients for the EBEE filter based upon sampling of the transmitted up-converted signal to minimize filtering errors. In certain implementations, estimating a refined value of a polynomial representing $D_{PRE}(v)$ based upon sampling the transmitted up-converted signal to minimize pre-distortion model errors. In certain implementations, estimating a refined value of filter coefficients for the EBEE filter is based upon sampling the transmitted up-converted signal to minimize filtering errors; and estimating a refined value of a polynomial representing $D_{PRE}(v)$ based upon sampling the transmitted up-converted signal to minimize pre-distortion model errors. In certain implementations, the estimating is carried out on a timed schedule to account for gradual changes in the nonlinearity; and/or the estimating is carried out whenever a system configuration change is made. In certain implementations, the estimating uses a switch fabric to isolate the pre-distortion function from the EBEE filtering function to adapt the pre-distortion and EBEE filtering respectively in isolation from one another. In certain implementations, the estimating is carried out by use of at least one of a least squares algorithm, a least mean squares algorithm and a recursive least squares algorithm to minimize errors using parametric estimation. In certain implementations, the radio transmitter nonlinearity is a radio frequency amplifier nonlinearity.

In accordance with further aspects of the present disclosure, there is provided a pre-distortion method of correction of radio transmitter nonlinearity that involves characterizing the transmitter nonlinearity as a distortion function $D(v)$, where v is an amplitude of the signal to be transmitted, and where the distortion components to be corrected are determined by the order of nonlinearity N to be corrected by the system; receiving a signal to be transmitted Tx(f) having a maximum significant frequency component at frequency $f_{TX}$; using a pre-distorter having a transfer function $D_{PRE}(v)$ that models a distortion characteristic to produce a pre-distorted signal $Tx_{PRE}(f)=D_{PRE}(Tx(f))$; filtering the pre-distorted signal $Tx_{PRE}(f)$ with an Effective Bandwidth Enhancement Equalizer (EBEE) filter to produce a filtered pre-distorted signal $Tx_E(f)$; passing the filtered pre-distorted signal $Tx_E(f)$ through a baseband filter having filter characteristics BB(f) to produce a corrected signal for transmission $Tx_C(f)=Tx_E(f)*BB(f)$, where the EBEE filter has a filter characteristic of $H_E(f)$, where $H_E(f)*BB(f)$ approximately equals 1 over the range of frequencies from a first corner frequency fC of BB(f) to frequency $N*f_{TX}$; up-converting the signal $Tx_C(f)$ to radio frequency for transmission; and transmitting the up-converted signal $Tx_C(f)$ at radio frequencies; estimating a refined value of filter coefficients for the EBEE filter based upon a sampling the transmitted up-converted signal to minimize filtering errors; estimating a refined value of a polynomial representing $D_{PRE}(v)$ based upon sampling the transmitted up-converted signal to minimize pre-distortion model errors, where the estimating uses a switch fabric to isolate the pre-distortion function from the EBEE filtering function to adapt the pre-distortion and EBEE filtering respectively in isolation from one another, and where the estimating is carried out by use of at least one of a least squares algorithm, a least mean squares algorithm and a recursive least squares algorithm to minimize errors using parametric estimation, and where the estimating is carried out on a timed schedule to account for gradual changes in the nonlinearity and the estimating is further carried out whenever a system configuration change is made.

In accordance with still further aspects of the present disclosure, there is provided a pre-distortion system that compensates for radio transmitter nonlinearity that has a pre-distorter configured to receive a signal to be transmitted Tx(f) having a maximum significant frequency component at frequency $f_{TX}$. The pre-distorter has a transfer function $D_{PRE}(v)$ that models a distortion characteristic to produce a pre-distorted signal $Tx_{PRE}(f)=D_{PRE}(Tx(f))$. An Effective Bandwidth Enhancement Equalizer filter is configured to receive the pre-distorted signal $Tx_{PRE}(f)$ with an Effective Bandwidth Enhancement Equalizer (EBEE) filter to produce a filtered pre-distorted signal $Tx_E(f)$. A baseband filter is configured to receive the filtered pre-distorted signal $Tx_E(f)$. The baseband filter has filter characteristics BB(f) so as to produce a corrected signal for transmission $Tx_C(f)=Tx_E(f)*BB(f)$, where the transmitter nonlinearity can be characterized as a distortion function $D(v)$, where v is an amplitude of the signal to be transmitted, and where the distortion components to be corrected are determined by the order of nonlinearity N to be corrected by the system, where the EBEE filter has a filter characteristic of $H_E(f)$, where $H_E(f)*BB(f)$ approximately equals 1 over the range of frequencies from a first corner frequency $f_C$ of BB(f) to frequency $N*f_{TX}$. An up-converting circuit is configured to convert the signal $Tx_C(f)$ to radio frequency. A transmitter circuit configured to transmit the up-converted signal $Tx_C(f)$ at radio frequencies.

In certain implementations, the system has a control circuit that is configured to estimate a refined value of filter coefficients for the EBEE filter based upon a sampling of the transmitted up-converted signal to minimize filtering errors. In certain implementations, the system has a control circuit that is configured to estimate a refined value of a polynomial representing $D_{PRE}(v)$ based upon sampling the transmitted up-converted signal to minimize pre-distortion model errors. In certain implementations, the system has a control circuit is configured to estimate: a refined value of filter coefficients for the EBEE filter based upon a sampling the transmitted up-converted signal to minimize filtering errors; and a refined value of a polynomial representing $D_{PRE}(v)$ based upon sampling the transmitted up-converted signal to minimize pre-distortion model errors. In certain implementations, the system has a switch fabric, and where the control circuit uses the switch fabric to isolate the pre-distortion function from the EBEE filtering function to adapt the pre-distortion and EBEE filtering respectively in isolation from one another in doing the estimate. In certain implementations, the estimating is carried out by use of at least one of a least squares algorithm, a least mean squares algorithm and a recursive least squares algorithm to minimize errors using parametric estimation. In certain implementations, the estimating is carried out using constraint functions as an input to the estimation algorithm. In certain implementations, the radio transmitter nonlinearity is a radio frequency amplifier nonlinearity. In certain implementations, the system has: a control circuit; and a digital to analog converter configured to convert the filtered pre-distorted signal $Tx_E(f)$ to analog format, and the baseband filter is an analog baseband filter, and the control circuit is configured to control a clock speed of the digital to analog converter. In certain implementations, the system has a control circuit, and where the baseband filter comprises a digitally controllable analog baseband filter, and where the control circuit is configured to control the baseband filter's transfer function BB(f). In certain implementations, the system has a control circuit, and where the control circuit is configured to control a number of poles of the EBEE filter and frequency response characteristics of the EBEE filter.

Hence, in pre-distortion method consistent with the present teachings, a signal to be transmitted Tx is pre-distorted to compensate for nonlinearities of a transmitter. The pre-distorted signal is filtered by an EBEE filter and a baseband filter. The EBEE filter has a filter characteristic of that cancels the baseband filter response over the range of frequencies from a first corner frequency of the baseband filter to a frequency of $N*f_B$ where N is a highest order of distortion component being cancelled and $f_B$ is the bandwidth of the original signal to be transmitted.

Traditional pre-distortion systems suffer from an inability to decouple receiver performance from transmitter performance. To achieve a highly linear and efficient transmitter, a high bandwidth pre-distortion system is called for. But, using high bandwidth digital pre-distortion has consequences for noise and residual signal emissions outside the transmitter bandwidth (putting the receiver at the risk of interference and associated performance problems). The resulting problem can be addressed using analog components with higher specifications and greater complexity. Noise is filtered using higher order analog filters and digital to analog converters (DACs) can be over-clocked to reduce the image artefacts. However, the tradeoffs of such approaches generally cause increased cost and complexity as well as other problems such as higher power consumption and associated reduced battery life.

To address this issue, the present teachings provide a way to linearize a transmitter using pre-distortion without requiring a significant increase in the bandwidth of the analog baseband filter. This is a very different approach than conventional pre-distortion systems, since this approach results in decoupling the design of the analog baseband filter and the associated digital to analog converters and analog to digital converters (DAC/ADCs) from the constraints imposed by the pre-distortion function.

The resulting system, in certain embodiments can provide for adaptive tuning of the pre-distorter and an associated linear filter; independent sequential tuning of both the linear and nonlinear system through the same measurement receiver; sequential update of the nonlinear and linear adaptive blocks through a switching and digital control fabric; an adaptive polar pre-distorter using CORDIC (COordinate Rotation DIgital Computer) hardware blocks to perform Cartesian to polar and polar to Cartesian transformations; decoupling of the analog front-end specifications from the digital transmitter front-end; tuning the analog front-end components to achieve power budget and performance specifications; allowing the receivers in a frequency domain duplex (FDD) system to operate without being desensitized by their associated transmitters; defining of constraint functions based on system specifications to allow effective adaptation; and achieving a gain in receiver sensitivity without significant additional components, or increased constraints on existing components Once all the requirements of the receiver and transmitter have been satisfied independently, the methods provided herein can be used to extract the improved performance from the transmitter using the present pre-distortion arrangement.

In accord with the present teachings, a radio transmitter provides for a digital pre-distortion method used in the linearization of nonlinear power amplifier characteristics. One difficulty found in the pre-distortion systems of today is that the use of pre-distortion can cause compromises to be imposed in a transceiver's receiver sensitivity. The presence of this difficulty sometimes precludes the inclusion of digital pre-distortion in modern commercial RFIC chipsets.

The basic concept of pre-distortion is to place a nonlinear system in cascade with the power amplifier (or other circuit exhibiting nonlinearity and thus producing distortion) in order to cancel out the distortion. This nonlinear system is configured such that the cascade of the two nonlinear systems forms a linear system (or an approximately linear system) in which the distortion artefacts are eliminated or substantially reduced. So, if the nonlinear distortion to be corrected is represented by D(v), where v is an amplitude of the signal to be transmitted, the pre-distorter should be configured to generate a $D_{PRE}(v)$ such that:

$$D(v)*D_{PRE}(v)=1$$

at values of frequency f over a frequency range to be corrected. Hence, the pre-distorter 104 has a transfer function $D_{PRE}(v)$ that produces a pre-distorted signal:

$$Tx_{PRE}(f)=D_{PRE}(Tx(f)).$$

The nonlinearity can be estimated as a polynomial or other correction factor representing the inverse of the nonlinearity $D_{PRE}(v)$ and the distortion can be compensated in this manner. In order to create a model of the inverse of the nonlinearity, an example implementation uses an iterative method where input and output of the power amplifier (distorting component in this case) is repeatedly passed through an estimator and statistical methods are used to perform linear and nonlinear regression on the data. However, in order to best utilize such pre-distortion, an adequate bandwidth of the frequency components of the pre-distorted signal should be available to reach the power amplifier. However, heretofore, this would mean a compromise in analog baseband filter constraints and potentially cause receiver problems. The practical problems are addressed in the present teaching of a pre-distortion system that can be realized within the constraints imposed by wireless systems of today.

Referring now to FIG. 1, a pre-distortion system 100 is depicted having a pre-distorter 104, which nonlinearly distorts the transmit input signal and passes the signal through a digital to analog converter (DAC or D/A) 108 and then filters the analog signal output through an analog baseband filter 112. This processed signal is then provided to the RF power amplifier 116 for transmission. It is noted that this illustration is greatly simplified for illustration of the concept and omits many circuit elements to clearly illustrate the concept. The single signal path depicted actually represents an I and a Q signal path.

It can be seen that the Tx signal first passes through pre-distorter 104 before passing through the DAC 108 which converts it into an analog signal. By its very definition the digital pre-distorter is a nonlinear system that generates frequency components that are not present in an ideal Tx signal. Being a nonlinear system this expands the signal bandwidth to much more than the original Tx bandwidth prior to the pre-distortion. This signal of increased bandwidth can only compensate for the power amplifier nonlinearities if allowed through the analog baseband filter 112 after the DAC 108. Hence, in order to be effective in countering the nonlinearity of the power amplifier 116, the baseband analog filter 112 is constrained to be wider in bandwidth than is desirable for optimal receiver operation. This imposes higher design specifications on the baseband filter 112 in order for the pre-distortion to be effectively utilized.

Figure 2A:
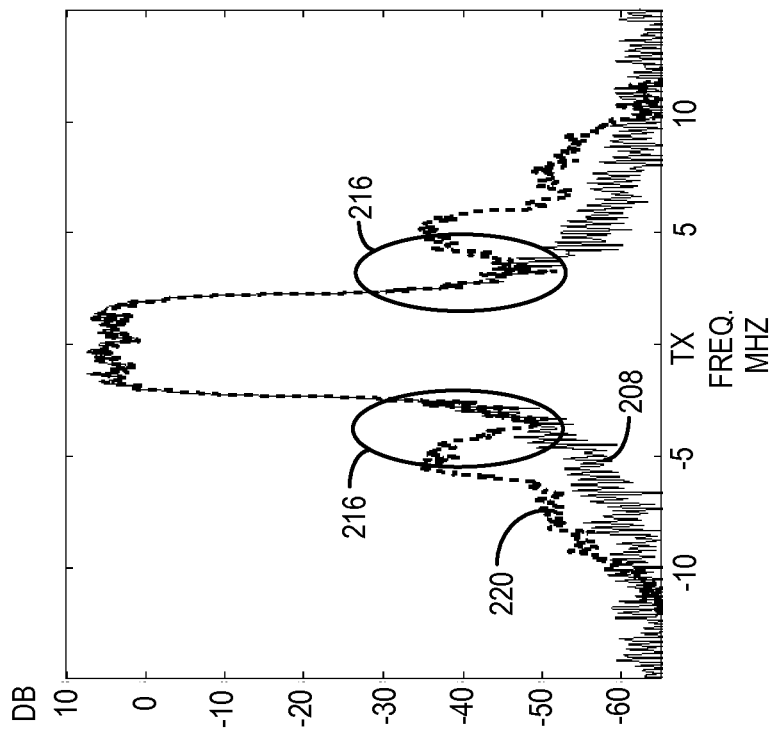
FIG. 2 is made up of FIG. 2a and FIG. 2b and illustrates the effect of band limiting the pre-distortion spectrum on the overall effectiveness of the pre-distortion process.
Figure 2B:
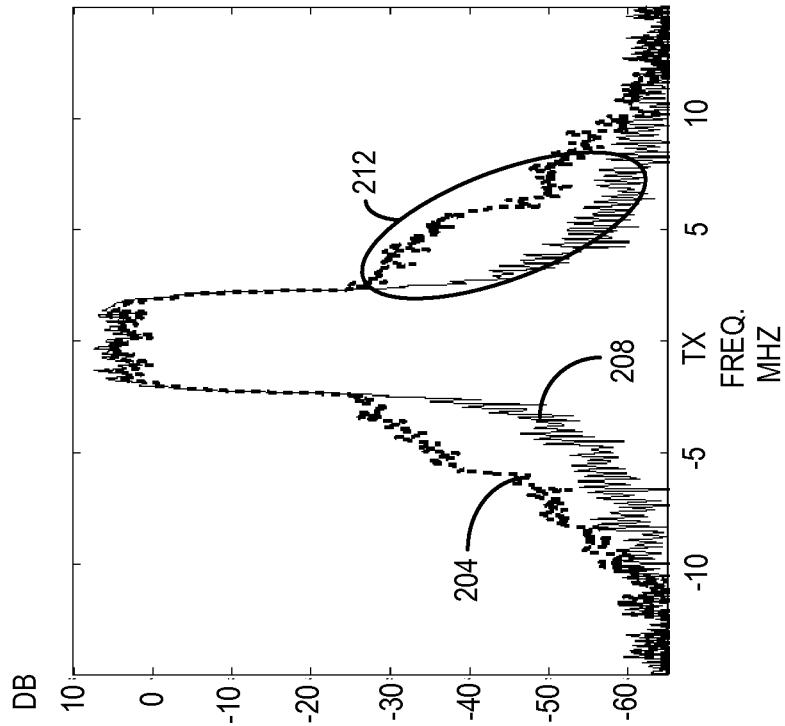

FIG. 2, which is made up of FIG. 2a and FIG. 2b, illustrates this phenomenon through example frequency spectra. When the original transmit signal is distorted, it undergoes spectral expansion shown by the distorted curve 204 in FIG. 2a. In this plot, the transmitter center frequency is depicted as Tx Freq. on the frequency scale which is incremented in megahertz and the magnitude on the vertical axis is in decibels. As seen in this curve 204 several bumps of increased magnitude of distortion components on the order of 10 to 25 dB above the undistorted curve 208 appear on each side of the center TX center frequency as a result of the distortion. This distortion is shown on the upper side of the Tx center frequency encircled by ellipse 212 and is approximately an image of the lower side of the Tx center frequency.

When compared to a fully compensated spectrum as shown in curve 208, this figure illustrates the substantial amount of power present in the adjacent bands of the transmitter signal as a result of the power amplifier's nonlinearities. In order to cancel all the harmonic emission in the adjacent band, the pre-distorter 104 produces signals in these adjacent bands that cancel out the distortion, but this can only happen if the signals in the adjacent bands created by the pre-distorter get through to the power amplifier (source of the distortion).

The cancellation of the distortion is accomplished using a signal that has nearly the same spectral content as that of the distorted signal spectrum 204. FIG. 2b shows what happens in this example if a filter having a cutoff frequency of 4 MHz is used between the pre-distorter and the power amplifier. In these spectra, undistorted curve 208 of the transmitter signal is again shown for reference. It is observed that pre-distortion is effective in reduction of the transmitter distortion as shown in region 216 of spectrum 220. But, the effect of the pre-distortion rapidly disappears as the simulated baseband filtering takes effect on signals above the 4 MHz bandwidth of the filter presenting side lobes that can still contribute to reduction in receiver sensitivity, especially if these side lobes fall within the receiver band of the transceiver. These sidelobes can additionally cause the transmitter to fail the emission requirements for the specific transmission standard. In order to meet the emission requirements at frequencies where pre-distortion is not effective, the power amplifier may have to be backed off in its input power which substantially compromises the efficiency of the power amplifier. Meeting the spectral leakage constraints with a narrow-band baseband filter is hence highly desirable.

Figure 3:
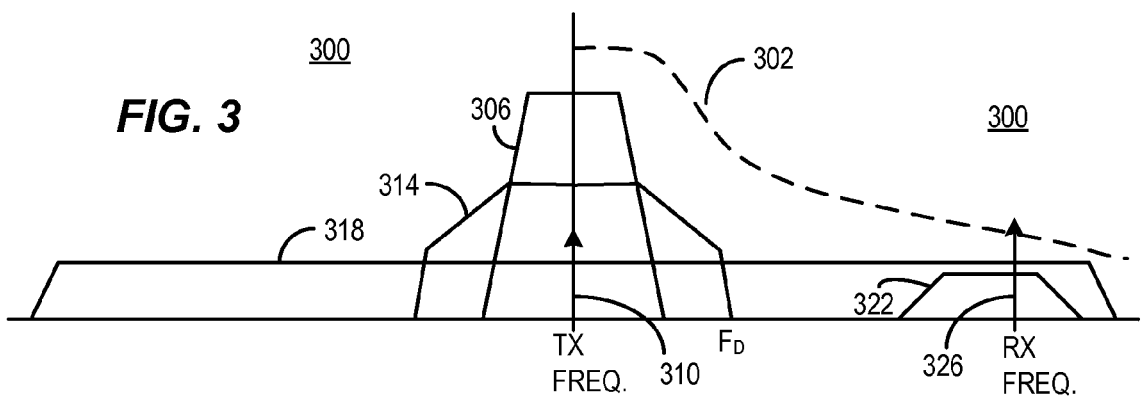
FIG. 3 is an illustrative graph depicting the frequency spectra generated by a transmitter and the frequency response of a baseband filter.

The analog baseband filter 112 between the pre-distorter and the power amplifier is used for several purposes and its function is depicted in graph 300 of FIG. 3 representing amplitude (or attenuation) versus frequency. This filter 112 is depicted as having a frequency response curve shaped similar to curve 302 superimposed over the upper half of the transmitter frequency (recalling that filter 112 is a baseband filter and actually operates at baseband rather than in the transmitter band). The transmitter signal frequency spectrum is depicted as curve 306 about the transmitter center frequency 310 with the spectrum produced by distortion components depicted as curve 314. Additionally, it is noted that the DAC produces noise whose spectrum is depicted as curve 318. Also of note is that the DAC produces an image of the transmit signal shown as curve 322 that is dependent on the DAC clock rate and other factors, and can show up along with DAC noise 318 inconveniently in the vicinity of the receive frequency 326 and its associated band (not shown). These factors can contribute to receiver desensitization and degraded receiver performance.

Baseband filter 112, with response overlaid as curve 302 is used for example to remove or reduce transmitted noise generated by the DAC 108 and to reduce the level of the DAC spectral image 322 of the transmitted signal appearing in the output so as to reduce the likelihood of interfering with receiver operation. Desirably, filter 112 also provides attenuation of all noise outside the transmitter's bandwidth that is generated within the radio. Since the filter characteristics are already significantly constrained to satisfy several system criteria, adding the additional constraint of not interfering with the effectiveness of the pre-distortion function further complicates this filter leading to high expense and performance compromises.

Hence, the DAC output produces a DAC noise floor 318 and a DAC image 322 at higher frequencies. The DAC noise 318 and DAC image 322 both fall outside the transmit band and into the receive (Rx) band of a frequency domain duplex system (FDD). As shown in FIG. 3, an arbitrary receiver frequency (Rx Freq.) 326 appears in the spectrum in which a part of the DAC image 322 is falling. This DAC image 322 and/or noise 318 can de-sensitize the receiver. In order to prevent that from happening, baseband analog filter 112 would be constrained to provide substantial filtering. Therefore the analog baseband filter cut-off should start at the lowest frequency possible and provide high levels of attenuation at the frequency range of the receive signal. This constraint on the analog baseband filter is in direct conflict the requirements of a pre-distortion system as seen in FIG. 2.

Figure 4:
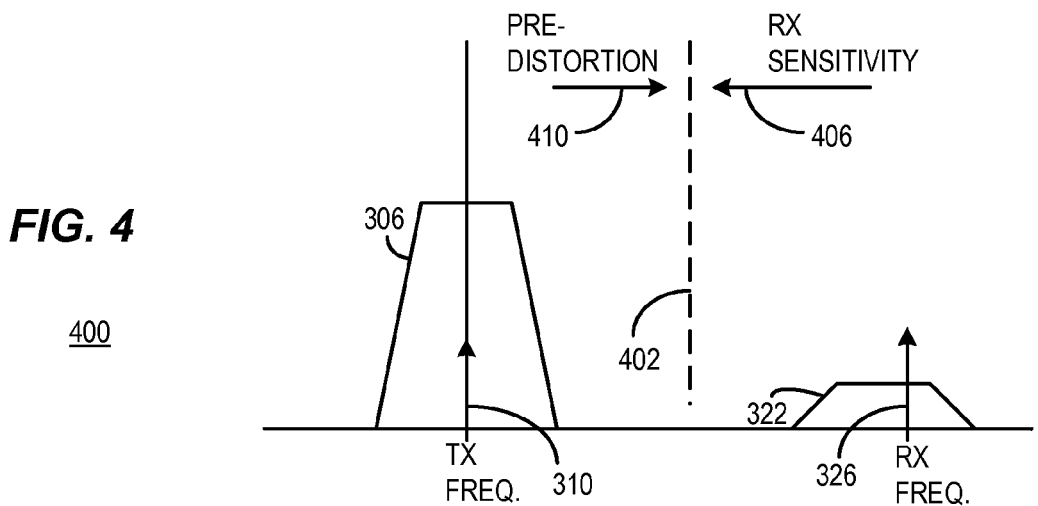
FIG. 4 is an illustrative graph depicting the conflicting constraints on a baseband filter between achieving good receiver sensitivity and having an effective pre-distortion system.

For pre-distortion to work effectively, the higher frequency components of the pre-distorter 104 should reach the power amplifier 116 so as to allow for correction of the higher frequency power amplifier distortion components in order to perform the adjacent channel reduction of spurious components. FIG. 4 shows this system trade-off in the context of graph 400. In this illustration, for a given baseband filter design the filter cutoff frequency is shown as 402. The receiver sensitivity requirement on filter 112 tends to push the cutoff frequency toward lower cutoff frequencies as shown by arrow 406. But, the pre-distorter would operate better with higher bandwidth in filter 112 thereby pushing the cutoff frequency higher in the direction of arrow 410, i.e., in opposite directions. Without use of a much more complicated, larger and more costly baseband filter 112, these constraints are directly at odds.

In order to satisfy these conflicting constraints, system designers may resort to a number of different tradeoffs and compromises. The DAC can be clocked at a higher clock frequency in order to shift the DAC image of the transmit spectrum to higher frequencies, but this results in higher power consumption and lower battery life. The noise at the DAC output can be reduced by oversampling and noise shaping, but this too consumes more power and reduces battery life in addition to increasing cost by use of more hardware. The filter requirements could be tightened on filtering at the output of the power amplifier, but this causes higher insertion loss, requiring higher operating power to overcome the insertion loss and greater cost, size and power consumption. All these different methods require increase in area, power, and cost/size of the radio hardware, each of which is undesirable.

In accord with the present teachings, these design constraints can be softened by delinking the analog filter cutoff requirements from the receiver sensitivity requirements. The analog baseband filter can be designed optimally to satisfy the receiver requirements, while the pre-distortion system can be separately manipulated to provide improved performance of the pre-distortion system. A modified pre-distortion system is thus provided where the design of analog baseband filter can be carried out without much thought into the bandwidth constraints that would otherwise be imposed by a pre-distortion system. The pre-distortion system, as a nonlinear system, continues to operate using higher bandwidth which is provided by the apparatus and methods discussed below in connection with an illustrative implementation of an embodiment consistent with the present invention.

Figure 5:
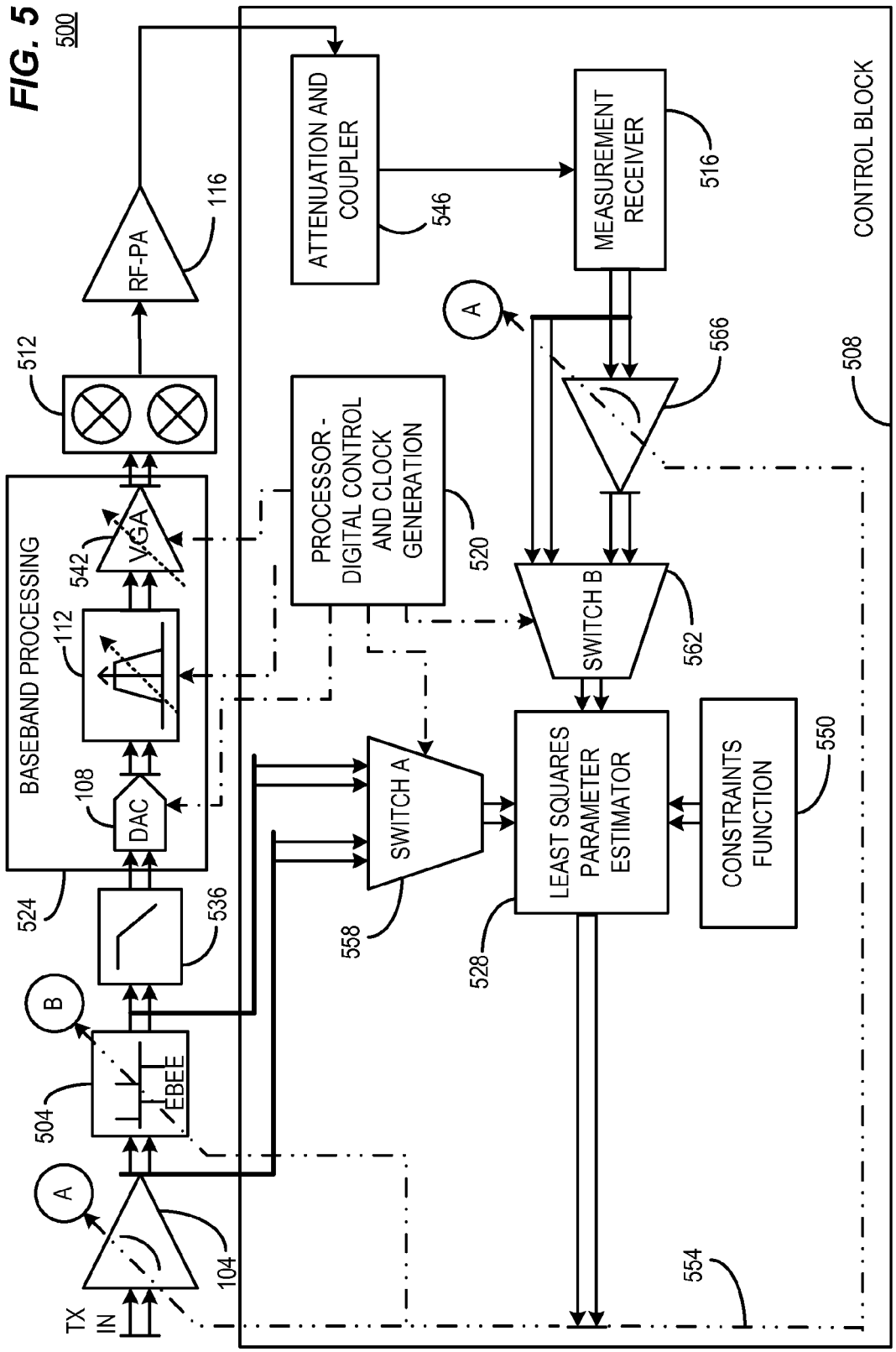
FIG. 5 is an illustrative block diagram of a transceiver system utilizing a pre-distortion system and refinement control consistent with certain embodiments.

An illustrative example of a pre-distortion system consistent with the present teachings is depicted as system 500 of FIG. 5 which utilizes circuitry to expand the operating bandwidth of the pre-distorter 104, by neutralizing or partially equalizing the response of the analog baseband filter 112. The pre-distorter operates on the input signal to be transmitted Tx(f). The transmitter nonlinearity can be characterized as a distortion function D(v), where v is amplitude of the signal to be transmitted, and where the distortion components to be corrected extend to frequency $f_D$ which is determined by the order of nonlinearity N to be corrected by the system The pre-distorter 104 produces a nonlinearity that counteracts D(v) by modeling D(v) to produce a counteracting transfer function $D_{PRE}(v)$ that produces a pre-distorted signal:

$$Tx_{PRE}(f)=D_{PRE}(Tx(f)).$$

The pre-distorter 104 being a nonlinear device, operates as a function of the amplitude of the signal to distort the signal in a manner opposite to that of the nonlinearity it is correcting and hence is written as an amplitude dependent function. In this instance pre-distorter 104 produces a pre-distorted signal that depends upon the amplitude of the frequency dependent function Tx(f). Such pre-distorting functions are generally represented in the time domain with the recognition that D(Tx) has an effect on the frequency spectrum.

The analog baseband filter 112 is a higher order filter that provides attenuation to spectral components far removed from the transmitter frequency and can be represented for purposes of this discussion as having a transfer function BB(f). The pre-distortion system 500, however, only uses more bandwidth in the vicinity of the transmit frequency (in order to cancel adjacent channel spurious emissions caused by the power amplifier 116 distortion). Thus, in the present embodiment, the baseband filter 112 is virtually unconstrained by the pre-distortion.

Figure 6:
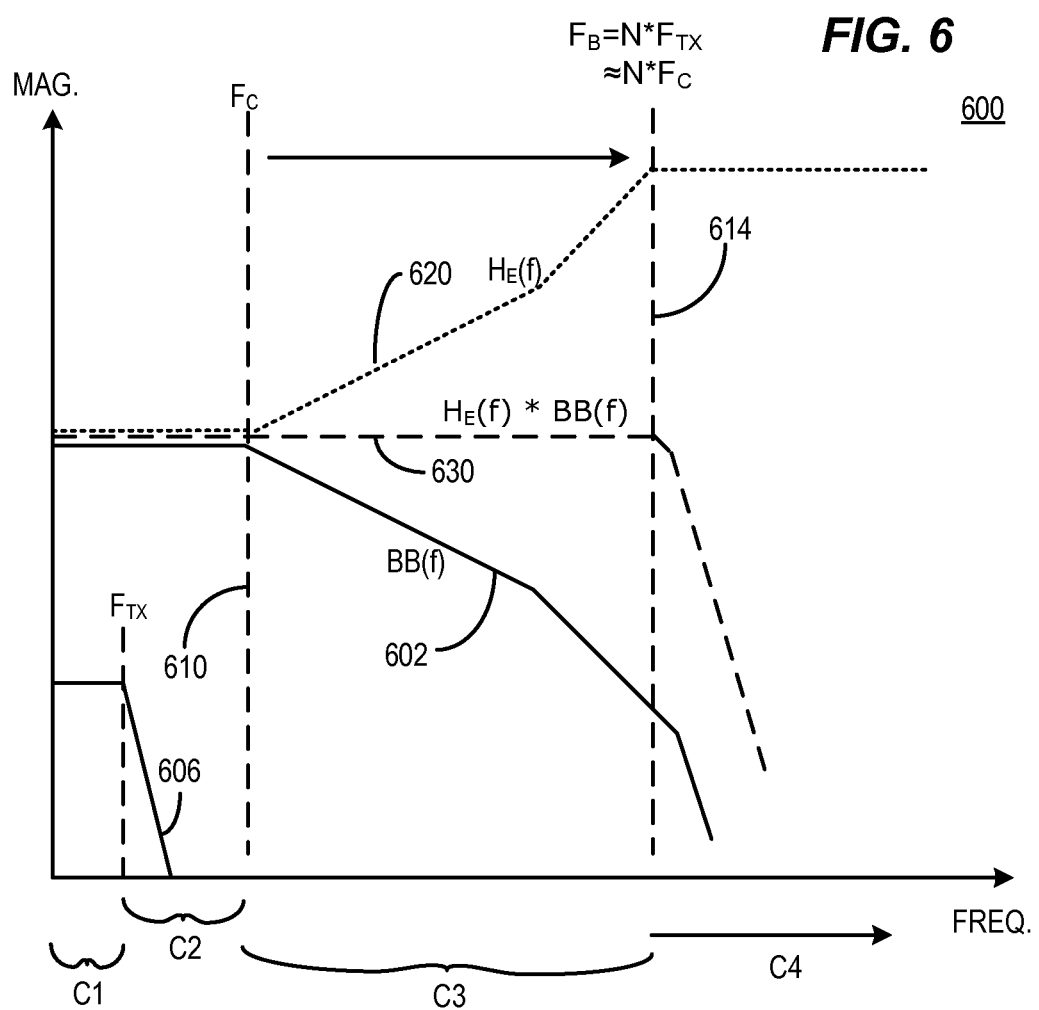
FIG. 6 is an illustrative graph depicting an example of a filter characteristics and constraints on an Effective Bandwidth Enhancement Equalizer (EBEE) filter used in implementing certain embodiments.

FIG. 6 depicts a frequency spectrum plot showing a piecewise linear sketch of the analog baseband filter 112's frequency response which will be referred to as BB(f) and is shown as 602 where corners represent frequencies in which the poles of the filter start becoming active as represented by the change of slope of 602. The transmitter signal spectrum is shown as 606 for reference. The regions depicted at the bottom of the plot are labelled as C1-C4 for ease of reference and are defined as follows:

C1=the region between zero and the ideal transmitted signal bandwidth $f_{TX}$.

C2=the region between the maximum of the ideal transmitted signal bandwidth $f_{TX}$ and the corner frequency $f_C$ of the analog baseband filter 112 (i.e., cutoff frequency, −3 dB frequency, etc.) shown by dashed line 610. This corner frequency is shown as an idealized corner, but it will be understood that there is a transitional area at the boundary of this region.

C3=the region between the lowest corner frequency of the analog baseband filter 112 and the highest frequency of power amplifier distortion to be corrected $f_B$ ending at the boundary of C4 as shown by dashed line 614. The boundary with C4 is described in greater detail below.

C4=the region beyond $f_B$ which represents the effective analog baseband filter 112 bandwidth.

The boundary between C3 and C4 is defined by the highest order of nonlinearity to be corrected by the pre-distortion. So, for example, for a low distortion power amplifier, distortion out to third order nonlinearity may be all that should be corrected. This leads to a tripling of bandwidth so that C3 extends out to 3× the bandwidth of the original signal to be transmitted i-e $3*f_{TX}$. For higher orders of distortion, the bandwidth can be modified similarly so that fifth order distortion leads to extending C3 out to 5× the bandwidth $f_{TX}$ and seventh order distortion leads to extending C3 out to 7× the bandwidth $f_{TX}$. In general, but without intent of being limiting, the odd order nonlinearities are of most concern for correction since even order nonlinearities generally reside far out of the spectrum of interest, but in general, the boundary of C3 and C4 is determined by the bandwidth of harmful distortion that is to be corrected. This in turn is dependent upon N=highest order of nonlinearity of concern.

To be precise, the signal that should be corrected in the present context has a bandwidth that should be passed by the analog baseband filter and is defined by the highest frequency caused by the nonlinearity that is to be corrected (linearized). To correct the pre-distorted signal the bandwidth that should be passed should contain all of the pre-distortion components. Thus, the EBEE filter in cascade with the analog baseband filter should pass the frequency components that are generated by the pre-distorter. This effectively becomes the baseband filter bandwidth $f_C$ for most purposes. So the bandwidth forming the boundary of C3 and C4 can be considered to be located at $N*f_C$, where $F_C$ is the first corner of the analog baseband filter characteristics BB(f). Strictly speaking, the bandwidth forming the boundary of C3 and C4 could more properly be considered to be the bandwidth of $N*f_{TX}$, where $f_{TX}$ is the upper frequency limit of the signal to be transmitted and N is the maximum order of nonlinearity of the distorting component but this can be approximated for purposes of the present teachings to $N*f_C$ which is a valid approximation if the baseband filter is designed only to pass the transmitted signal. Hence, $f_B = N*f_{TX} \approx N*f_C$ for a baseband filter designed to only pass the transmitted signal spectrum in region C1.

By definition, an EBEE filter 504 consistent with the present teachings has a filter characteristic in region C3 that when cascaded with the baseband filter has a composite frequency response is approximately flat in region C3, and which has frequency response characteristics in the other regions C1, C2 and C4 that is not significantly detrimental to transmitter or receiver performance. So, for purposes of this document:

$H_E(f)$, where $H_E(f)*BB(f)$ approximately equals 1 over the range of frequencies from a first corner frequency $f_C$ of BB(f) to a frequency of $f_B$ as shown by 630. But, it is noted that beyond $f_B$, a rolloff response that increases the rejection of undesirable signals beyond $f_B$ is permissible and desirable.

FIG. 6 shows the response of the analog baseband filter 112 on the frequency axis as 602. In the region where correction of distortion of the power amplifier 116 is to be carried out (C3), the pre-distortion components should be allowed to reach the power amplifier. Hence, in accord with the present teachings the digital filter 504 of system 500 is adjusted to compensate for the filter response of the analog baseband filter 112 by having frequency response shown in dotted lines as curve 620 in region C3 between $f_C$ and $f_B$. This portion of the frequency response of filter 504 effectively pushes out the bandwidth available for pre-distortion from about the frequency $f_C$ shown as 610 to the frequency $f_B$ shown as 614 without otherwise significantly impacting the constraints imposed on analog baseband filter 112. Filter 504 should have a relatively flat passband at region C1 out to $f_{TX}$. Filter 504 should also have a relatively flat passband in region C2 out to $f_C$, but can deviate from flat response somewhat with ripple, pole transition artefacts, etc., without significant impact. In region C3 between $f_C$ and $f_B$, the frequency response of EBEE filter 504 should be an approximate mirror image of the frequency response of analog baseband filter 112.

So, between $f_C$ and $f_B$, the frequency response of EBEE filter can be represented by $H_E(f)$ where in region C3, $H_E(f)*BB(f)=1$. In region C4, the filter 504 can have a somewhat arbitrary response so long as it is not amplifying in this region, and desirably may even provide additional attenuation in this region C4.

In the pre-distortion system 500, the system bandwidth is limited to the first pole cutoff point of the analog baseband filter 112. After the analog filter roll-off, the digital inverse filter response 620 compensates for the analog baseband filter response in region C3. This inverse filter response can compensate for the analog filter roll-off and effectively flatten the overall response of the digital-analog filter cascade provided by filters 504 and 112. This means that the composite response of the cascaded analog-digital filters appears flatter for a larger range of frequencies out to about 614 as shown in graph 600. The pre-distortion system can thus make use of this extended bandwidth to allow for correction of spurious emission over a larger range of frequencies.

In accord with these teachings, in the immediate vicinity of the transmitter frequency, adequate equalization of analog baseband filter 112's response can be accomplished by a relatively simple digital filter 504 which can be programmed and/or tuned by control block 508 from the knowledge of the analog baseband filter 112's response in the region between the desired transmit spectrum and the receive frequency band, as will be described in connection with FIG. 6. For purposes of this discussion, the EBEE filter has a filter characteristic transfer function which will be referred to as $H_E(f)$, where:

$$H_E(f)*BB(f) \approx 1$$

over the range of frequencies from a first corner frequency $f_C$ of BB(f) to a frequency of the highest distortion component to be corrected $f_B$. Thus the filtered and pre-distorted signal $Tx_E(f)$ is passed through the analog baseband filter having filter characteristics BB(f) to produce a signal corrected signal for transmission $Tx_C(f)=Tx_E(f)*BB(f)$, where the EBEE filter has a filter characteristic of $H_E(f)$, where $H_E(f)*BB(f)$ approximately equals 1 over the range of frequencies from a first corner frequency $f_C$ of BB(f) to frequency $N*f_B \approx N*f_C$.

Referring back to FIG. 5, the present circuit arrangement is shown with filter 504 which is referenced herein as an Effective Bandwidth Enhancement Equalizer (EBEE) which can be defined as a frequency domain component (generally implemented as a digital component) that when cascaded with a band-limiting analog filter, allows the other system components preceding it (the pre-distorter) to experience more bandwidth than allowed by the analog baseband filter itself. The adaptive loops within correction block 508 surround the pre-distorter 104 and the EBEE filter 504. For the purpose of simplicity, some of the RF blocks in the transceiver are omitted. For example the up-conversion mixer and the associated circuitry are represented on as RF up-converter 512. Similarly the down conversion mixer, low noise amplifier (LNA), analog to digital converters (ADCs) are all lumped into a measurement receiver block 516 which is construed to mean any apparatus used to convert a high frequency received signal into baseband I/Q signals. For further simplicity, the I/Q paths are not shown separately in the diagram but are indicated through the use of double lines for this illustrative system 500.

The system 500 provides for the joint adaptation and tuning of the nonlinear pre-distorter and the linear EBEE filter, using adaptive signal processing, estimation and digital control loops. The adaptation, tuning and calibration scheme for the EBEE filter allows all the tradeoffs to be included into the adaptive formulation of the problem.

In system 500, adaptive pre-distorter 104 provides nonlinearity that is devised to cancel the nonlinearities of the power amplifier 116 and is generally represented by a polynomial of order N. Pre-distorter 104 and the adaptive EBEE filter (or equalizer) 504 are in a forward loop. The adaptive EBEE equalizer filter 504 works as a function of the current state of various other circuit blocks contained in the transceiver chain. These circuit blocks include the baseband analog filter 112, the DAC 108, and different control functions executed by a digital control and clock generation circuit (a programmed processor based circuit) 520 to provide configuration and adjustment of the pre-distorter 104, the EBEE digital filter 504 and circuits in the baseband processing block 524.

The adaptive pre-distorter 104 and the adaptive EBEE digital filter 504 are both complex blocks which take I/Q data and complex coefficients (either in Cartesian or polar format) to manipulate the signal waveforms of the TX input signal. A constrained least squares algorithm is used in this illustrative embodiment by the least squares parameter estimator 528 to update both the EBEE filter coefficients and the pre-distorter coefficients sequentially using digital control logic, and each of the adaptation loops as signified by the circled letters A and B.

The algorithm for adaptation of pre-distorter 104 and EBEE filter 504 can be any parametric estimation method, including least squares, least mean squares (LMS), recursive least squares, or any other method of constrained parametric estimation. In this manner, the system adapts by estimating a refined value of filter coefficients for the EBEE filter based upon samples of the transmitted up-converted signal to minimize filtering errors, and estimates a refined value of a polynomial representing $D_{PRE}(v)$ based upon samples of the transmitted up-converted signal to minimize pre-distortion model errors.

When the Tx signal input is received at pre-distorter 104 (as a complex I/Q signal), the Tx signal is pre-distorted by a distortion function that is derived to approximate the opposite of the distortion that is introduced by power amplifier 116. This function may subsequently be adapted by control block 508 as will be described later. The pre-distorted signal is then processed by the digital EBEE filter 504 so as to effectively extend the bandwidth of the pre-distorted signal into region C3 as discussed earlier. After the filtering at 504, additional low pass filtering may be carried out at 536 in order to suppress any signal that may be present as an artefact of pre-distorting at 104 and filtering at 504.

Filter 536 should be an all pass filter for the signals of interest in this discussion including the original Tx signal bandwidth and the additional bandwidth generated by the pre-distortion which is desirable to get through, but may be used to attenuate higher frequency artefacts. The output of filter 536 is provided to the baseband processing block 524 so that it can be converted to analog form at DAC 108 and filtered by analog baseband filter 112. The output of filter 112 may be amplified by a variable gain amplifier 542 before entry into the RF up-converter 512 (which may include mixers, filters, oscillators, etc.). The RF up-converted signal is then ready for transmission by the RF Power Amplifier (RF-PA) 116. A sample of the transmitted signal from RF-PA 116 is attenuated and coupled at 546 for analysis in the control block 508.

It is noted that the present discussion refers to filter 112 as an analog baseband filter. While this filter 112 is currently implemented as an analog filter, its filter characteristics can be varied by use of electronic switches that switch in various capacitor values, etc. under control of processor 520 so as to be able to optimize the filter for a particular circumstance.

Speaking generally, the control block samples the output of RF-PA 116 and makes a determination as to how the pre-distortion should be modified and how the EBEE filter 504 coefficients should be modified to achieve satisfactory and desirably optimal performance. This is generally done by conversion of the sample to I/Q form at receiver 516 and sending that sample to parameter estimator 528. Parameter estimator takes this data along with a constraints function that can be represented as a matrix of operational parameters of the transceiver's mode of operation. Since multiple modes of operation corresponding to various transceiver front end properties (e.g., low power, high bandwidth carrier aggregation, multiple transmit/redeye antennas, high peak to average ratio data signals, etc.) can utilize common circuitry with similar problems, this characterization in the constraints function 550 for a particular transceiver enables the present pre-distortion processing to be used across multiple transceiver platforms. Once the analysis is complete for a sample or collection of samples, the estimator 528 can provide as output control signals shown in broken lines as 554 to pre-distorter 104 as control signals "A" that defines the pre-distortion and control signals "B" that define the filter characteristics EBEE 504 (or modifications thereof in each case). The processor 520 also controls the operation of DAC 108 and generates the clock signals therefor and digitally adjusts the parameters of the analog baseband filter 112 and controls the gain of amplifier 542.

Processor 520 also controls a switch fabric made up of switch A 558 and switch B 562. Switch A 558, under control of processor 520 selects which of the signals either from the output of pre-distorter 104 and EBEE filter 504 is supplied to the estimator 528 so that the estimator has access to both the unfiltered pre-distorted Tx signal and the subsequently filtered version of the pre-distorted Tx signal. Additionally, switch B 562 provides the estimator 528 with either the direct sample of the attenuated signal from RF-PA 116 from receiver 516, or with a distorted version of the signal produced by a post-distorter 566. In the case of the distorted version from post-distorter 566, the signal from receiver 516 is distorted with a function opposite (i.e., the complement of) of the pre-distorter's current characteristics. This provides the ability to switch to an undistorted version for filter training for EBEE filter 504. When adapting the pre-distorter it is desirable to exclude the filter effects on the system and when adapting the pre-distortion it is desirable to exclude the filter effects. This is accomplished under control of processor 520 by use of switches 558 and 562.

In the system 500, Loop A (depicted by the circled A) works by training the adaptive pre-distorter. In this illustrative case, the EBEE filter coefficients are set to unity (all-pass) and selector switches A and B (558 and 562 respectively) are configured to tap a reference signal after the EBEE filter 504 and the all pass transmission (bypassing post-distorter 566) after the measurement receiver 516 respectively. This allows the estimator 528 to work only on tuning the pre-distorter 104 to match the nonlinear characteristics of the system, especially RF-PA 116. Hence, the switch fabric is used to isolate the pre-distortion function from the EBEE filtering function to adapt the pre-distortion and EBEE filtering respectively in isolation from one another.

Experiments have shown that the adaptation of the adaptive pre-distorter 104 can proceed independently of the EBEE filter 504 in a preliminary iteration, and any bandwidth restrictions imposed either on the transmitter or the measurement receiver 516 can still allow nonlinear system characterization to take place. The nonlinear coefficients of the adaptive pre-distorter 104 can be learned with imperfect frequency domain characteristics (because the frequency domain response is not a function of nonlinearities).

After learning the nonlinear characteristics, the ideal response of the EBEE filter 504 can be learned by the system by configuring switches A and B (558 and 562) to tap the signal before the EBEE equalizer 504 and after the measurement receiver with the nonlinear post distorter 566 included. This configuration allows for adaptation of the EBEE filter 504, allows tuning of nonlinear coefficients while excluding the effect caused by any nonlinearities present in the system which can be nullified by the post-distorter 566. The switches 558 and 562 are controlled by the processor 520 (which can be specifically embedded logic or programmed inside a digital signal processor having a suitable control channel). The processor 520 can alternatively switch between the two different adaptive configurations described above to adapt the pre-distorter 104 and the EBEE filter 504 successively until both have reached convergence to a stable state, after which steady state slower update of the coefficients can continue. Updates may be periodic or based upon detection of an anomaly or system configuration change that suggests updating. Many variations will occur to those skilled in the art upon consideration of the present teachings.

Figure 7:
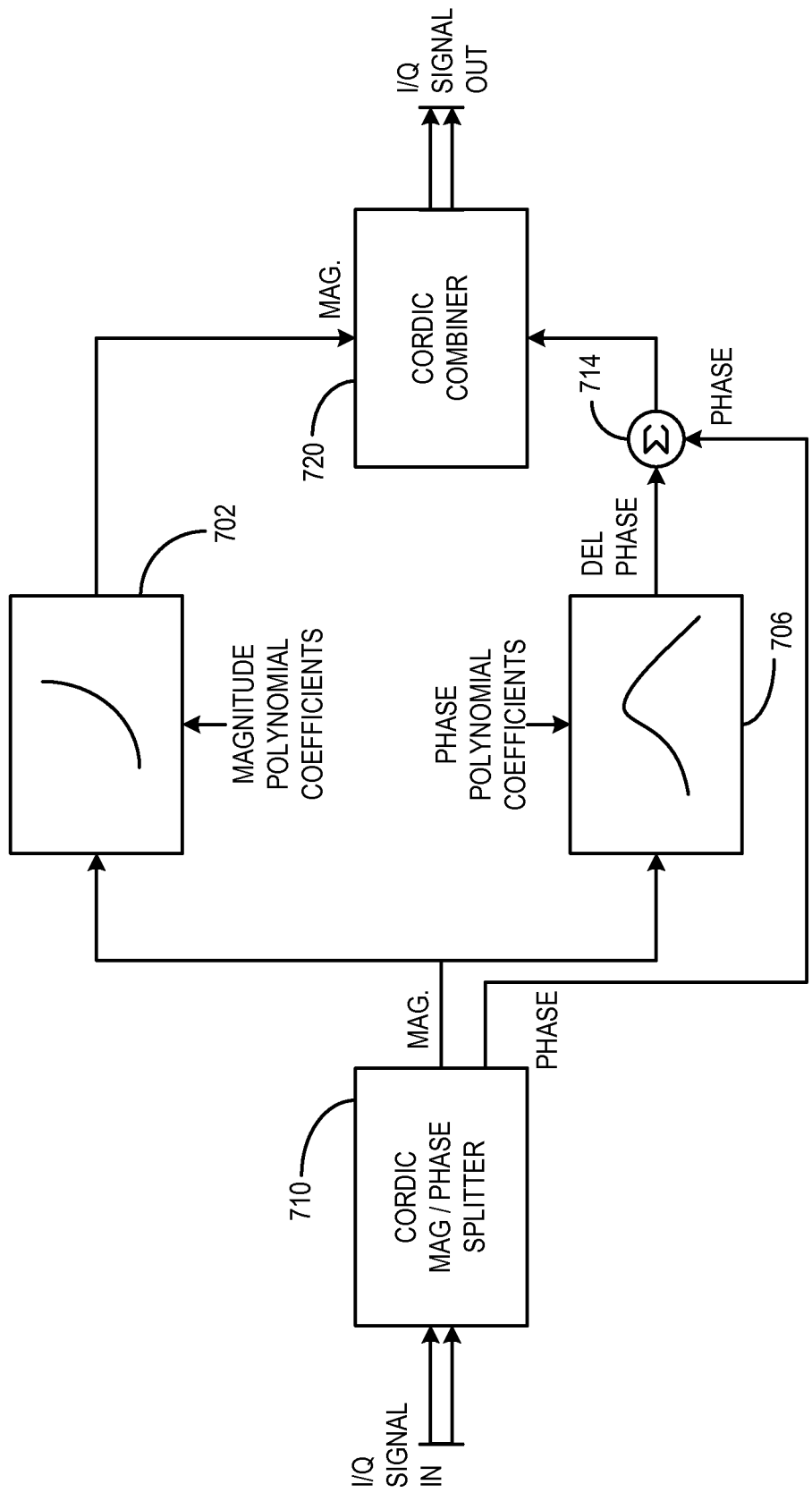
FIG. 7 is an illustrative detailed block diagram of one implementation of a pre-distorter consistent with certain embodiments.

The adaptive pre-distorter 104 in system 500 uses a polar architecture as shown in FIG. 7 in accord with certain implementations. This polar architecture allows for tuning of amplitude nonlinearity, as well as phase nonlinearity, with a polynomial having only five terms. In the example shown in this illustration, adaptive coefficients enter the pre-distorter from the estimator 528 as magnitude polynomial terms that are applied to block 702 and phase polynomial coefficients applied to block 706. As shown by the complex signal path arrow in the beginning, an I/Q Tx signal reaches the pre-distorter 104 at a CORDIC (COordinate Rotation DIgital Computer) magnitude and phase splitter 710 and is converted into a magnitude and phase representation by the CORDIC splitter.

The magnitude is processed using two separate polynomial functions, a magnitude function 702 and a phase function 706. Function 702 is given magnitude coefficients while function 706 is supplied with phase polynomial coefficients. These two sets of coefficients represent two different polynomials estimated by the estimator block. The magnitude processed by the magnitude polynomials at 702 forms one input to an output CORDIC block 720 that creates the I/Q output signal. The magnitude processed by the phase polynomial at 706 is added at 714 to the original phase signal from 710 to create the second input to the CORDIC combiner block 720. This architecture allows the Mag/Mag polynomial to code the transformation from input to output magnitude, but the Mag/Phase polynomial to only code the difference in input vs. output phase. The actual phase can be a complicated mathematical function with discontinuities and hence is not amenable to a polynomial representation.

In one example, the system 500 provides for adaptive updates of the pre-distorter 104 and the EBEE filter 504 if any fundamental system configuration is altered. For example if the DAC 108's clock frequency is changed to allow reduced power consumption, or the pole location of the analog baseband filter 112 is altered to allow for increased noise attenuation. In case of any such change in system configuration, the adaptive EBEE filter 504 can be retrained to converge to the response of the new configuration. If no such change occurs, the adaptive pre-distorter can be allowed to simply update slowly to account for slow changes in the response of the power amplifier over temperature and time. For example, the adaptation can be programmed to occur on a periodic basis such as once every several minutes (e.g., one to five minutes).

The digital control and clock generation circuitry 520 therefore has access to the programmable analog baseband filter 112, and the clock input of the DAC 108. This access is shown by the adaptive arrows in the block diagram of system 500. This control allows the digital circuitry to change the system configuration with a lower bandwidth analog filter 112, or a higher DAC 108 clocking frequency. As mentioned above, the EBEE filter 504 can be retrained to converge to new settings. By way of example, changes to the pre-distorter 104 and EBEE filter 504 may be used to accommodate a change in the transceiver to operate in a low power output mode (e.g., when it is close to a base-station), low power consumption mode (e.g., high received signal-to-noise ratio (SNR)) or a different band setting (e.g., due to having high noise or error rate). These controls therefore allow the system to change many different parameters, and allow the adaptive blocks to lock on to the new configuration. This provides for power saving and performance optimization by use of such flexible pre-distortion.

The illustrative system 500 uses an adaptive least squares parameter estimator block 528. This block finds values of coefficients for the pre-distorter 104 and the EBEE filter block 504 using a least squares estimation technique. The least squares parameter estimator 528 also takes a configuration input from constraint function 55. Constraint function 550 provides data about the configuration of analog components in the system 500 including bandwidth of analog baseband filter 112 and the clocking frequency of the DAC 108. Thus any configuration change made by the digital control circuitry is passed on to estimator 528 through the constraint function 550. The method of generating this constraint function 550 is detailed below.

The constraints used by the estimator 528 are established by several parameters of the communication system. There are several transmission standard specifications and system design parameters that can affect the EBEE filter 504 and represent constraints that are taken into consideration in constraint function 550 and used by estimator 528. For example, the minimum DAC image attenuation is dictated by radio emission standards specification. The filter order of the analog baseband filter 112 is dictated by power and noise requirements. The DAC 108 clock frequency has a relationship to power consumed which imposes further constraints.

The actual attenuation achieved on the DAC image is a function of analog baseband filter 112 cut-off frequency and order. To satisfy the DAC image attenuation specification either significantly increases the filter order, or reduces the low frequency corner frequency. As seen previously, low cut-off frequency of filter 112 does not allow the pre-distortion system to work effectively and the high order filtering leads to high power consumption and increases the system noise floor (assuming active filtering). Therefore all the above mentioned system parameters of DAC image attenuation, output noise level, filter order, filter cut-off and pre-distortion accuracy are trade-offs with each other. By use of the present teachings, some of these trade-offs are softened to allow for low cut-off frequency, low filter order, low clock frequency, and high pre-distortion accuracy to all coexist. Thus it allows the system components to be manipulated to many different configurations, each of which can offer different practical benefits.

The constraints provided to the estimator 528 allows for the estimator 528 to converge successfully to the filter coefficients for the EBEE filter 504. Referring back to FIG. 6, the Tx signal spectrum, which has passed through a nonlinear pre-distorter 104 leads to an extension of bandwidth in region C3 representing a pre-distorted spectrum. The attenuating filter response 602 represents the baseband filtering, and the inverse response shown as 620 is that of an ideal EBEE equalizer.

Figure 8:
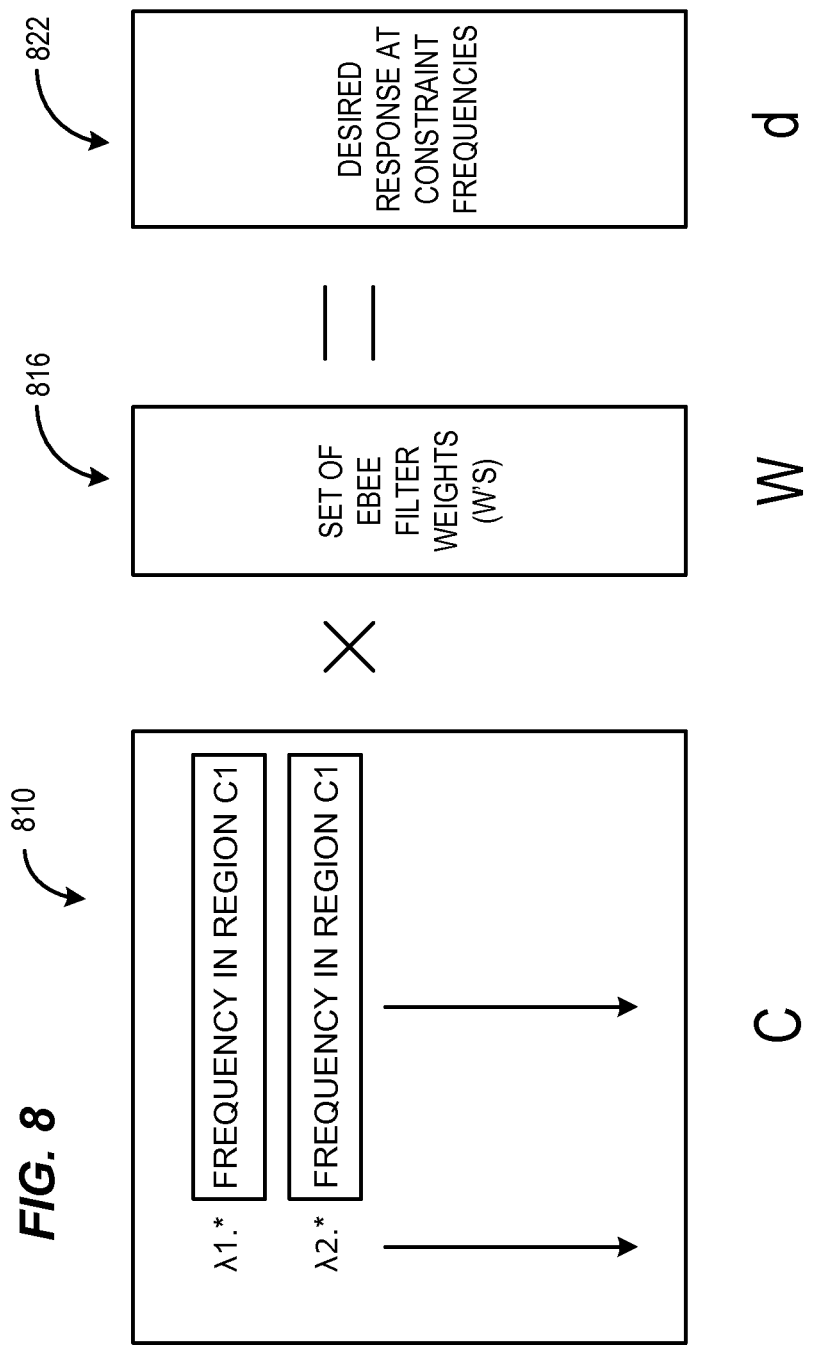
FIG. 8 is an illustration of one of the matrix equations involved in optimizing performance of a system consistent with certain embodiments.

Constraint regions were denoted by the C1, C2, C3 and C4 designations previously discussed. These constraint regions represent different factors imposed on the design of the EBEE equalizer 504. For example constraint region one, C1, is the region of original bandwidth of the Tx signal. The frequency response of filtering in this region should be kept as flat as possible. The frequency of the outer corner of this region bordering C2 is already known from the Tx signal bandwidth and this can be programmed as a constraint where the magnitude of the equalizer is set to one. Similarly constraint region C2 extends from Tx signal bandwidth to about the first corner frequency of the analog baseband filter 112. In this region the response of the EBEE equalizer filter 504 should be relatively flat but some level of ripple tolerance is permissible here. The constraints on region C2, however, can be weighted lower than the most stringent constraint region C1 in the adaptation process to be described later. C3 is the constraint defined by the analog baseband filter 112 characteristics and has a high weighting factor. C4 is constrained to not amplify, but no gain or any amount of loss in region C4 is generally permissible or even desirable. The constraints can thus be written as a set of weighted matrix constraint coefficients C as depicted as matrix 810 in FIG. 8 where $\lambda$ is a weighting factor applied to the different constraints. For example, $\lambda$ can range from 0 to 1 based on how rigid the constraints on the equalizer are in each of regions C1, C2, C3 and C4. Each constraint in the system can have a different weighting factor $\lambda$ that can be decided by the designer of the system. Multiplication of the matrix 810 by the EBEE filter weights matrix 816 (W) results in the desired response at constraint frequencies at 822($d$).

Figure 9:
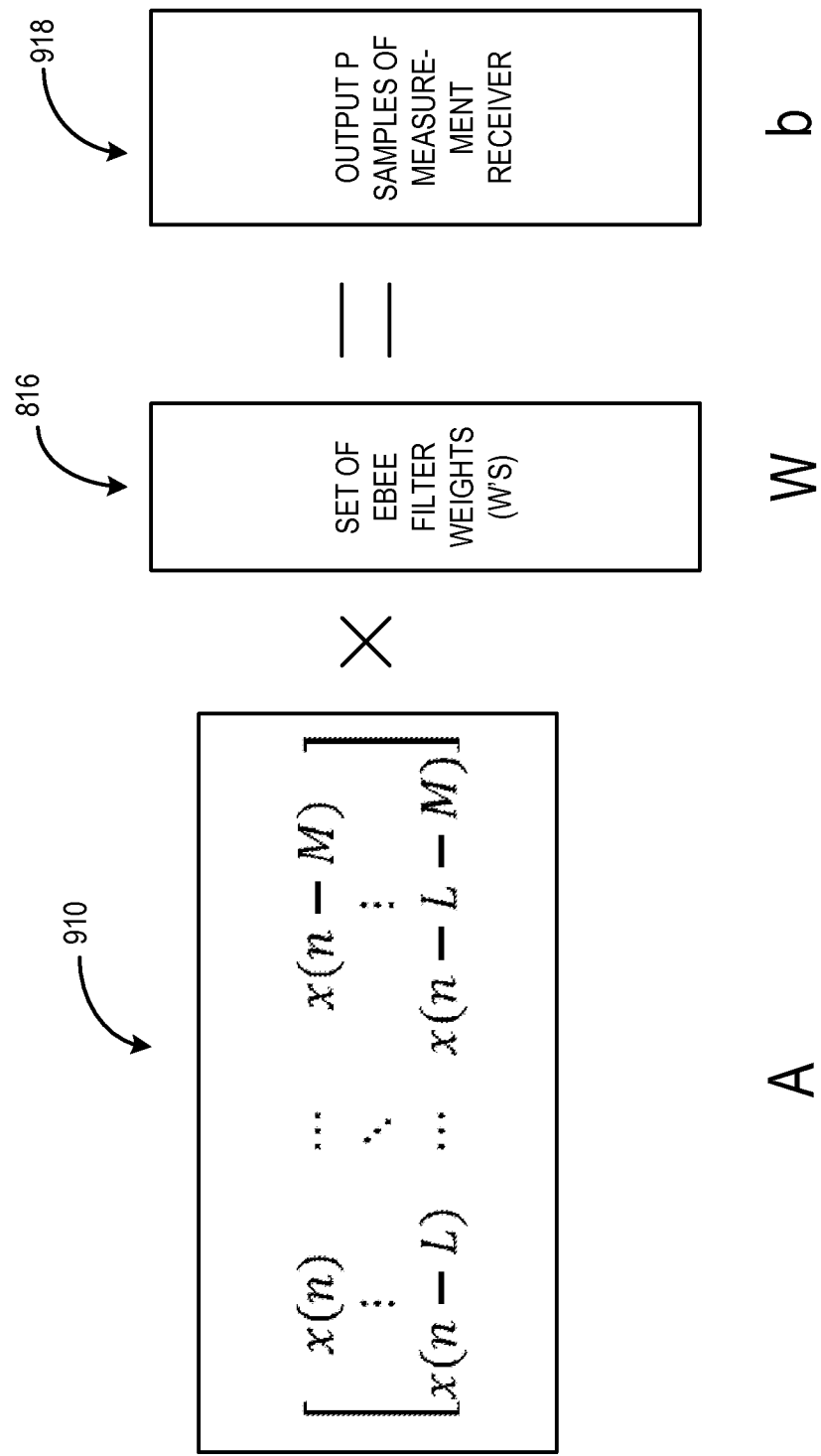
FIG. 9 is an illustration of one of the matrix equations involved in optimizing performance of a system consistent with certain embodiments.

This constraint matrix 810 can be combined with the fundamental least squares matrix problem of finding the best mean squared error equalizer from the data pumping through the adaptive loop. If matrix A (910) represents the matrix of data going through the loop, and vector b (918) represents the output coming from the measurement receiver, the basic least squares method of writing the finding out the ideal equalizer can be written as shown in FIG. 9:

Where M represents the length of the adaptive EBEE filter (i.e., the number of taps in the delay line of a tapped delay line finite impulse response (TDL FIR) filter) and L represents the number of data samples captured to create an estimate of filter coefficients, and n is a counter. Ordinarily one would solve the ordinary least squares equation using the following mathematical operation:

$$\min_{w} \|Aw - b\|$$

which directs the least squares solver to find the w vector which satisfies the constraint of minimizing the norm of the squared error between Ax and b, where A represents the data matrix and b represents the vector of system output values and w represents the optimal coefficients to be found. The revised criterion for least squares after incorporating the constraints imposed by the transceiver configuration can be written as:

$$\min_{w} \left\| \begin{pmatrix} \lambda.*C \\ A \end{pmatrix} w - \begin{pmatrix} \lambda.*d \\ b \end{pmatrix} \right\|$$

which combines the two problems into a composite least squares problem that can be solved using any suitable least square method including normal equations, QR decomposition or Singular Value Decomposition (SVD), etc.

Using the constraint function definition method described herein, and constrained least squares solution method, the parameters of the adaptive EBEE filter 504 can be calculated by the estimator 528. The estimator 528 can be realized as a programmed computer or processor or other piece of digital hardware configured to manipulate a streaming array of numbers at the transmitter and measurement receiver 516 and provide as an output the parameters for the EBEE filter 504 and the adaptive pre-distorter 104.

Figure 10:
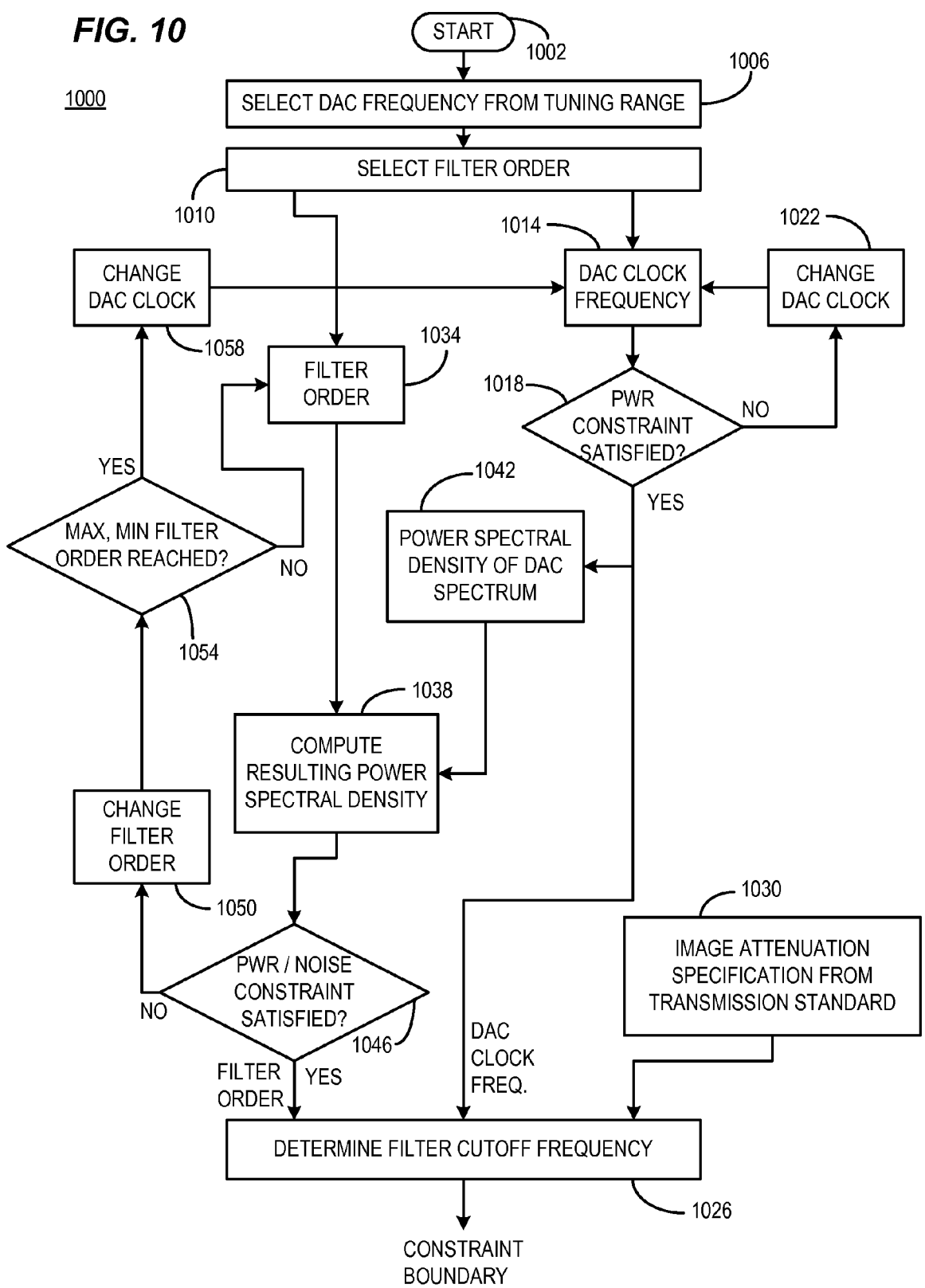
FIG. 10 is a flow chart depicting an illustrative process for selection of constraint boundaries in a manner consistent with certain embodiments.

FIG. 10 illustrates that various system constraints can be manipulated to arrive at differing system configurations imposed on the design of the EBEE filter 504. In this illustration, it is shown that the DAC clocking frequency can be modified to save on the transceiver power budget. Additionally the analog baseband filter can be tuned to a lower frequency pole to save power as well as reduce the out of band transmitter noise. Both these changes will impact the operating bandwidth of the pre-distorter, that is, under what circumstances the adaptive EBEE filter provides its bandwidth expansion capability. Hence, the system parameters can be altered to allow the filter to converge to a new system configuration. The flow chart 1000 of FIG. 10 represents an illustrative decision diagram focusing on the optimization of the DAC clocking frequency and the baseband filter configuration. These parameters can be changed by the digital control circuit 520 shown in the block diagram of system 500. With the change in these parameters, allowed by a reconfigurable analog front-end, the additional methods disclosed herein can be successfully used to allow for multiple different operational modes.

Referring now to FIG. 10, an illustrative flow chart depicts an illustrative process 1000 for selection of constraint boundaries consistent with the present teachings starting at 1002. At 1006, a DAC frequency is selected based upon the current radio tuning range. A filter order is selected for the EBEE filter 504 at 1010. With the given clock frequency at 1014, the system can determine if a power consumption constraint is met at 1018. Overclocking the DAC can cause the radio to consume significantly more power, and hence the frequency of the DAC clock can be a significant variable in determining the overall power consumption of the transceiver. If the constraint is not satisfied, the DAC clock frequency is adjusted at 1022 until the power consumption constraint is met at 1018. Once this power consumption constraint is met, the DAC clock frequency is provided to block 1026 as one component of determination of the EBEE filter 504 cutoff frequency. Image attenuation constraints as specified by various standards are also input to 1026 from 1030 as a component in determination of filter cutoff frequency.

The selected filter order 1034 as selected at 1010 is provided as an input to 1038 which computes a power spectral density which is combined with a spectral power density provided by 1042 representing the power spectral density of the DAC spectrum determined from the DAC clock frequency from 1018. The resulting power spectral density is examined at 1046 to determine if a power/noise constraint is satisfied. If so, the resulting filter order is provided to 1026 for computation of constraint boundaries. If not, the filter order is changed at 1050. A determination is then made as to whether the minimum or maximum allowed filter order has been reached at 1054 and if not the filter order can be changed at 1034 and the new order supplied to 1038. However, if the minimum or maximum filter order has been reached, the system is constrained to adjust the DAC clock frequency at 1058, and this new clock frequency is established at 1014 for a new iteration of determining if the power constraint is satisfied. In this manner, DAC clock frequency and filter order are reconciled along with the system specifications to provide data to 1026 in order to select an appropriate filter cutoff frequency and output this as a constraint boundary. This constraint boundary is then used for the cut-off frequency of the baseband filter. It is noted that this exercise can be performed by the system design at the start, and a number of different configurations optimized for different modes of operation can be determined, which can be programmed into the transceiver digital memory. The transceiver can then load any appropriate configuration based on the operating band, received signal strength, carrier aggregation mode, or multiple transmit/receive antenna mode, etc.

Figure 11:
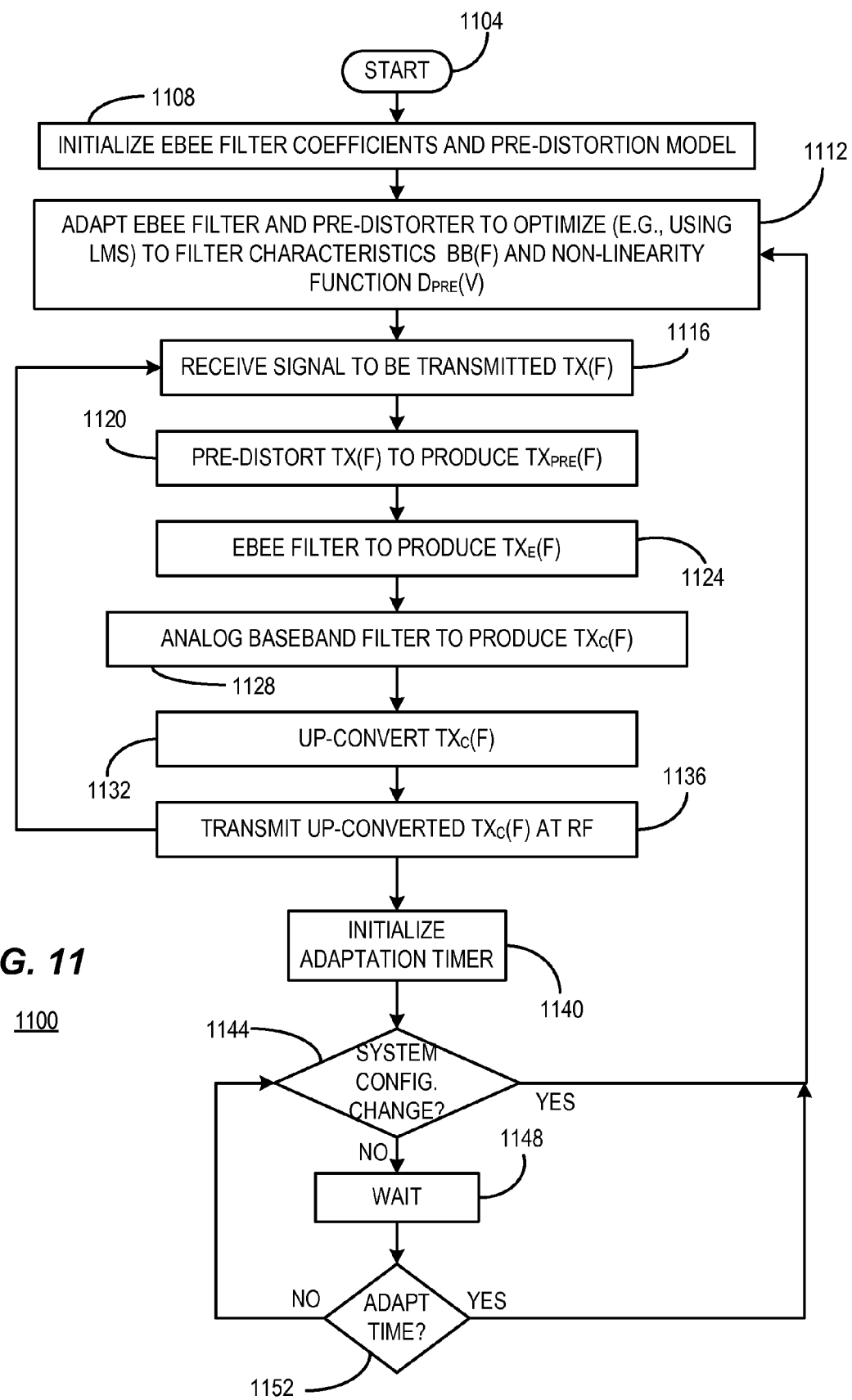
FIG. 11 is a flow chart depicting an illustrative process consistent with certain embodiments.

Referring now to FIG. 11, an illustrative process 1100 consistent with certain embodiments is depicted starting at 1104 after which the EBEE filter coefficients and pre-distortion polynomial model are initialized by characterizing the transmitter non-linearity as a distortion function D(v), where v is amplitude of the signal to be transmitted and $f_{TX}$ is the upper limit of significant frequency components of the signal to be transmitted, and where the distortion components to be corrected extend to a frequency $f_D$ which is determined by the order of nonlinearity N to be corrected by the system. The pre-distorter and EBEE filter coefficients are then optimized in an adaptation process, for example, using a least mean square algorithm at 1112 to obtain the BB(f) and $D_{PRE}(v)$ functions. When a signal to be transmitted Tx(f) is received at 1116 the pre-distorter having a transfer function $D_{PRE}(v)$ that models the distortion characteristic is used to produce a pre-distorted signal $Tx_{PRE}(f)=D_{PRE}(Tx(f))$ at 1120. The EBEE filter then acts upon the $Tx_{PRE}(f)$ signal to filter it and produce a filtered pre-distorted signal $Tx_E(f)$ at 1124. This signal is then passed through the baseband filter having filter characteristics BB(f) to produce a signal corrected signal for transmission $Tx_C(f)=Tx_E(f)*BB(f)$ at 1128. The EBEE filter has a filter characteristic of $H_E(f)$, where $H_E(f)*BB(f)$ approximately equals 1 over the range of frequencies from a first corner frequency $f_C$ of BB(f) to frequency $f_B=N*f_{TX}$. At 1132, up-converting is carried out on the signal $Tx_C(f)$ to produce a radio frequency band signal for transmission, and the signal the up-converted signal $Tx_C(f)$ is transmitted at radio frequencies at 1136.

In certain implementations, the EBEE filter 504 and pre-distorter 104 can be adapted slowly at this point unless a system configuration parameter changes. At 1140, an adaptation timer can be set by processor 520 to determine times between slow adaptation iterations (e.g., about one to five minutes for example). The system can then be checked to see if a system configuration change has been implemented at 1144. If so, the process returns to 1112 for a new adaptation cycle. If not, the process waits at 1148 for a short time (e.g., five to thirty seconds) and then checks the adaptation timer at 1152 to determine if it is time to run an adaptation cycle for slow adaptation. If not, control returns to 1114. If so, the process returns to 1112 for a new adaptation cycle. It will be understood that the process shown as a loop from 1116 through 1136 are carried out as long as a Tx signal is being received and is shown as an inner loop to represent this process. Many variations will occur to those skilled in the art upon consideration of the present teachings.

In accord with the present teachings, the adaption process involves estimating a refined value of filter coefficients for the EBEE filter based upon a sampling the transmitted up-converted signal to minimize filtering errors and estimating a refined value of a polynomial representing $D_{PRE}(v)$ based upon sampling the transmitted up-converted signal to minimize pre-distortion model errors.

In simulations of one radio design, the use of the present system produced improvements in adjacent channel leakage ratio (ACLR) of approximately 10-12 dB over similarly simulated systems not having pre-distortion for this radio design and over similarly simulated systems using very tight baseband filtering. This simulation produced ACLR results that were within about 8-10 dB of the best results that could be obtained with simulations that use no baseband filtering at all. Further, these simulated results were achieved without requiring fundamental and expensive changes in the radio's analog front-end.

The order in which the optional operations represented in the various processes may be carried out in any operational order. Thus, while the blocks comprising the methods are shown as occurring in a particular order, it will be appreciated by those skilled in the art that many of the blocks may be interchangeable and can occur in different orders than that shown without materially affecting the end results of the methods.

The implementations of the present disclosure described above are intended to be examples only. Those of skill in the art can effect alterations, modifications and variations to the particular example embodiments herein without departing from the intended scope of the present disclosure. Moreover, selected features from one or more of the above-described example embodiments can be combined to create alternative example embodiments not explicitly described herein.

Those skilled in the art will recognize, upon consideration of the above teachings, that certain of the above exemplary embodiments are based upon use of one or more programmed processors. However, the invention is not limited to such exemplary embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

While certain elements of embodiments herein were described in conjunction with specific circuitry that carries out the functions described, other embodiments are contemplated in which the circuit functions are carried out using equivalent executed on one or more programmed processors. General purpose computers, microprocessor based computers, micro-controllers, optical computers, analog computers, dedicated processors, application specific circuits and/or dedicated hard wired logic and analog circuitry may be used to construct alternative equivalent embodiments. Other embodiments could be implemented using hardware component equivalents such as special purpose hardware and/or dedicated processors.

Those skilled in the art will appreciate, upon consideration of the present teaching, that the processes described above can be implemented in any number of variations and in many suitable programming languages without departing from embodiments of the present invention. For example, the order of certain operations carried out can often be varied, additional operations can be added or operations can be deleted without departing from certain example embodiments of the invention. Error trapping can be added and/or enhanced and variations can be made in user interface and information presentation without departing from certain example embodiments of the present invention. Such variations are contemplated and considered equivalent.

It will be appreciated that any module or component disclosed herein that executes instructions may include or otherwise have access to non-transitory and tangible computer readable media such as storage media, computer storage media, or data storage devices (removable or non-removable) such as, for example, magnetic disks, optical disks, or tape data storage, where the term "non-transitory" is intended only to exclude propagating waves and signals and does not exclude volatile memory or memory that can be rewritten. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the server, any component of or related to the network, backend, etc., or accessible or connectable thereto. Any application or module herein described may be implemented using computer readable/executable instructions that may be stored or otherwise held by such computer readable media.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. A pre-distortion method of correction of radio transmitter nonlinearity, comprising:
representing the radio transmitter nonlinearity as a distortion function $D(v)$, where v is an amplitude of a signal to be transmitted, and where a set of distortion components to be corrected are determined by an order of nonlinearity N to be corrected, where N is the order of nonlinearity;
receiving the signal to be transmitted $Tx(f)$ having a maximum significant frequency component at frequency $f_{TX}$;
using a pre-distorter having a transfer function $D_{PRE}(v)$ that models a distortion characteristic to produce a pre-distorted signal $Tx_{PRE}(f)=D_{PRE}(Tx(f))$;
filtering the pre-distorted signal $Tx_{PRE}(f)$ with an Effective Bandwidth Enhancement Equalizer (EBEE) filter to produce a filtered pre-distorted signal $Tx_E(f)$;
passing the filtered pre-distorted signal $Tx_E(f)$ through a baseband filter having filter characteristics $BB(f)$ to produce a corrected signal for transmission $Tx_C(f)=Tx_E(f)*BB(f)$,
where the EBEE filter has a filter characteristic of $H_E(f)$, where $H_E(f)*BB(f)$ approximately equals 1 over the range of frequencies from a first corner frequency $f_C$ of $BB(f)$ to frequency $N*f_{TX}$, where N is the order of nonlinearity;

up-converting the signal $Tx_C(f)$ to radio frequency for transmission; and transmitting the up-converted signal $Tx_C(f)$ at radio frequencies.

2. The method according to claim 1, further comprising estimating a refined value of filter coefficients for the EBEE filter based upon sampling of the transmitted up-converted signal to minimize filtering errors.

3. The method according to claim 1, further comprising estimating a refined value of a polynomial representing $D_{PRE}(v)$ based upon sampling the transmitted up-converted signal to minimize pre-distortion model errors.

4. The method according to claim 1, further comprising estimating:

a refined value of filter coefficients for the EBEE filter based upon sampling the transmitted up-converted signal to minimize filtering errors; and a refined value of a polynomial representing $D_{PRE}(v)$ based upon sampling the transmitted up-converted signal to minimize pre-distortion model errors.

5. The method according to claim 4, where estimating at least one of the refined value of filter coefficients and the refined value of the polynomial:

is carried out on a timed schedule to account for gradual changes in the nonlinearity; and is carried out whenever a system configuration change is made.

6. The method according to claim 4, where the estimating at least one of the refined value of filter coefficients and the refined value of the polynomial:

uses a switch fabric to isolate the pre-distortion function from the EBEE filtering function to adapt the pre-distortion and EBEE filtering respectively in isolation from one another.

7. The method according to claim 4, where estimating at least one of the refined value of filter coefficients and the refined value of the polynomial is carried out by use of at least one of a least squares algorithm, a least mean squares algorithm and a recursive least squares algorithm to minimize errors using parametric estimation.

8. The method according to claim 1, where the radio transmitter nonlinearity comprises a radio frequency amplifier nonlinearity.

9. A pre-distortion method of correction of radio transmitter nonlinearity, comprising:

representing the transmitter nonlinearity as a distortion function $D(v)$, where v is an amplitude of a signal to be transmitted, and where a set of distortion components to be corrected are determined by an order of nonlinearity N to be corrected, where N is the order of non-linearity;

receiving the signal to be transmitted $Tx(f)$ having a maximum significant frequency component at frequency $f_{TX}$;

using a pre-distorter having a transfer function $D_{PRE}(v)$ that models a distortion characteristic to produce a pre-distorted signal $Tx_{PRE}(f)=D_{PRE}(Tx(f))$;

filtering the pre-distorted signal $Tx_{PRE}(f)$ with an Effective Bandwidth Enhancement Equalizer (EBEE) filter to produce a filtered pre-distorted signal $Tx_E(f)$;

passing the filtered pre-distorted signal $Tx_E(f)$ through a baseband filter having filter characteristics $BB(f)$ to produce a corrected signal for transmission $Tx_C(f)=Tx_E(f)*BB(f)$, where the EBEE filter has a filter characteristic of $H_E(f)$, where $H_E(f)*BB(f)$ approximately equals 1 over the range of frequencies from a first corner frequency $f_C$ of $BB(f)$ to frequency $N*f_{TX}$, where N is the order of non-linearity;

up-converting the signal $Tx_C(f)$ to radio frequency for transmission; and transmitting the up-converted signal $Tx_C(f)$ at radio frequencies;

estimating a refined value of filter coefficients for the EBEE filter based upon a sampling the transmitted up-converted signal to minimize filtering errors;

estimating a refined value of a polynomial representing $D_{PRE}(v)$ based upon sampling the transmitted up-converted signal to minimize pre-distortion model errors, where estimating at least one of the refined value of filter coefficients and the refined value of the polynomial uses a switch fabric to isolate the pre-distortion function from the EBEE filtering function to adapt the pre-distortion and EBEE filtering respectively in isolation from one another, and is carried out by use of at least one of a least squares algorithm, a least mean squares algorithm and a recursive least squares algorithm to minimize errors using parametric estimation, and is carried out on a timed schedule to account for gradual changes in the nonlinearity and the estimating is further carried out whenever a system configuration change is made.

10. A pre-distortion system that compensates for radio transmitter nonlinearity, comprising:

a pre-distorter configured to receive a signal to be transmitted $Tx(f)$ having a maximum significant frequency component at frequency $f_{TX}$;

the pre-distorter having a transfer function $D_{PRE}(v)$ that models a distortion characteristic to produce a pre-distorted signal $Tx_{PRE}(f)=D_{PRE}(Tx(f))$;

an Effective Bandwidth Enhancement Equalizer (EBEE) filter configured to receive the pre-distorted signal $Tx_{PRE}(f)$ to produce a filtered pre-distorted signal $Tx_E(f)$;

a baseband filter configured to receive the filtered pre-distorted signal $Tx_E(f)$, the baseband filter having filter characteristics $BB(f)$ to produce a signal corrected signal for transmission $Tx_C(f)=Tx_E(f)*BB(f)$, where the transmitter nonlinearity can be characterized as a distortion function $D(v)$, where v is an amplitude of the signal to be transmitted, and where distortion components to be corrected are determined by order of nonlinearity N to be corrected by the system, where N is the order of non-linearity, where the EBEE filter has a filter characteristic of $H_E(f)$, where $H_E(f)*BB(f)$ approximately equals 1 over the range of frequencies from a first corner frequency $f_C$ of $BB(f)$ to frequency $N*f_{TX}$, where N is the order of non-linearity;

an up-converting circuit configured to convert the signal $Tx_C(f)$ to radio frequency; and a transmitter circuit configured to transmit the up-converted signal $Tx_C(f)$ at radio frequencies.

11. The system according to claim 10, further comprising a control circuit that is configured to estimate a refined value of filter coefficients for the EBEE filter based upon a sampling of the transmitted up-converted signal to minimize filtering errors.

12. The system according to claim 10, further comprising a control circuit that is configured to estimate a refined value of a polynomial representing $D_{PRE}(v)$ based upon sampling the transmitted up-converted signal to minimize pre-distortion model errors.

13. The system according to claim 10, further comprising a control circuit that is configured to estimate:

a refined value of filter coefficients for the EBEE filter based upon a sampling the transmitted up-converted signal to minimize filtering errors; and a refined value of a polynomial representing $D_{PRE}(v)$ based upon sampling the transmitted up-converted signal to minimize pre-distortion model errors.

14. The system according to claim 13, further comprising a switch fabric, and where the control circuit uses the switch fabric to isolate the pre-distortion function from the EBEE filtering function to adapt the pre-distortion and EBEE filtering respectively in isolation from one another in doing the estimate.

15. The system according to claim 13, where estimating at least one of the refined value of filter coefficients and the refined value of the polynomial is carried out by use of at least one of a least squares algorithm, a least mean squares algorithm and a recursive least squares algorithm to minimize errors using parametric estimation.

16. The system according to claim 13, where estimating at least one of the refined value of filter coefficients and the refined value of the polynomial is carried out using constraint functions as an input to the estimation algorithm.

17. The system according to claim 10, where the radio transmitter nonlinearity comprises a radio frequency amplifier nonlinearity.

18. The system according to claim 10, further comprising:
a control circuit; and
a digital to analog converter configured to convert the filtered pre-distorted signal $Tx_E(f)$ to analog format, and
where the baseband filter comprises an analog baseband filter, and
where the control circuit is configured to control a clock speed of the digital to analog converter.

19. The system according to claim 10, further comprising a control circuit, and where the baseband filter comprises a digitally controllable analog baseband filter, and where the control circuit is configured to control the baseband filter's transfer function BB(f).

20. The system according to claim 10, further comprising a control circuit, and where the control circuit is configured to control a number of poles of the EBEE filter and frequency response characteristics of the EBEE filter.

* * * * *